(12) United States Patent
Cho et al.

(10) Patent No.: US 9,034,232 B2
(45) Date of Patent: May 19, 2015

(54) METHOD FOR MANUFACTURING ETHYLENE VINYL ACETATE COPOLYMER SHEET FOR SOLAR CELL ENCAPSULANT

(75) Inventors: Jae Whan Cho, Anyang-si (KR); Jae Hyuck Han, Seoul (KR); Goo Hyeong Lee, Seoul (KR); Kyung Hyun Kim, Seosan-si (KR)

(73) Assignee: SAMSUNG TOTAL PETROCHEMICALS CO., LTD., Seosan-si (KR)

( * ) Notice: Subject to any disclaimer, the term of this patent is extended or adjusted under 35 U.S.C. 154(b) by 399 days.

(21) Appl. No.: 13/394,938

(22) PCT Filed: Apr. 28, 2011

(86) PCT No.: PCT/KR2011/003148
§ 371 (c)(1),
(2), (4) Date: Mar. 8, 2012

(87) PCT Pub. No.: WO2012/020910
PCT Pub. Date: Feb. 16, 2012

(65) Prior Publication Data
US 2012/0168982 A1 Jul. 5, 2012

(30) Foreign Application Priority Data

Aug. 12, 2010 (KR) .................. 10-2010-0077725

(51) Int. Cl.
| | | |
|---|---|---|
| *B29B 9/06* | (2006.01) | |
| *B29B 9/16* | (2006.01) | |
| *C08J 5/18* | (2006.01) | |
| *H01L 31/048* | (2014.01) | |
| *C08K 5/00* | (2006.01) | |
| *C08K 5/14* | (2006.01) | |
| *C08K 5/5425* | (2006.01) | |
| *B29K 31/00* | (2006.01) | |

(52) U.S. Cl.
CPC .............. *C08J 5/18* (2013.01); *B29K 2031/04* (2013.01); *H01L 31/0481* (2013.01); *Y02E 10/50* (2013.01); *C08J 2331/04* (2013.01); *C08K 5/0025* (2013.01); *C08K 5/005* (2013.01); *C08K 5/14* (2013.01); *C08K 5/5425* (2013.01)

(58) Field of Classification Search
CPC .... B29B 9/06; B29B 9/065; B29B 2009/161; B29B 2009/163; B29B 9/12; B29K 2031/04
USPC ......................................................... 264/211
See application file for complete search history.

(56) References Cited

U.S. PATENT DOCUMENTS

| | | | | |
|---|---|---|---|---|
| 4,197,381 | A * | 4/1980 | Alia ............................. | 525/222 |
| 4,342,844 | A * | 8/1982 | Torenbeek et al. ........... | 525/387 |
| 4,857,250 | A * | 8/1989 | Gale et al. ...................... | 264/83 |
| 5,574,094 | A * | 11/1996 | Malucelli et al. ............ | 525/54.3 |
| 2009/0159129 | A1 | 6/2009 | Kataoka | |
| 2009/0289381 | A1* | 11/2009 | Burmeister et al. ........... | 264/1.1 |
| 2011/0168262 | A1* | 7/2011 | Sakojiri ........................ | 136/259 |

FOREIGN PATENT DOCUMENTS

| | | | |
|---|---|---|---|
| JP | 2008159856 | | 7/2008 |
| KR | 1020100082923 | | 7/2010 |
| WO | WO2010024176 | * | 3/2010 |
| WO | 2007094445 | | 7/2010 |

OTHER PUBLICATIONS

International search report dated Feb. 6, 2012 in corresponding PCT/KR2011/003148.

* cited by examiner

*Primary Examiner* — Matthew Daniels
(74) *Attorney, Agent, or Firm* — Young & Thompson

(57) ABSTRACT

Provided is a method for manufacturing a sheet for a solar cell encapsulant which has stability against yellowing after a crosslinking process and thus good appearance with improved productivity in the sheet manufacture process, specifically to a method for manufacturing a sheet for a solar cell encapsulant characterized by melt-mixing a resin composition with an organic peroxide, a co-crosslinking agent and a silane coupling agent at the degradation temperature of the organic peroxide or less, wherein the resin composition is obtained by melt-mixing EVA resin with an antioxidant, an UV absorber and a light stabilizer at 80-220° C., and forming a sheet from the obtained melt-mixed resin composition.

13 Claims, No Drawings

METHOD FOR MANUFACTURING ETHYLENE VINYL ACETATE COPOLYMER SHEET FOR SOLAR CELL ENCAPSULANT

TECHNICAL FIELD

The present invention relates to a method for manufacturing a sheet for a solar cell encapsulant which has stability against yellowing after a crosslinking process and thus good appearance with improved productivity in the sheet manufacture process, specifically to a method for manufacturing a sheet for a solar cell encapsulant characterized by melt-mixing a resin composition with an organic peroxide, a co-crosslinking agent and a silane coupling agent at the degradation temperature of the organic peroxide or less, wherein the resin composition is obtained by melt-mixing an ethylene vinyl acetate copolymer (hereinafter, referred as 'EVA') resin with an antioxidant, an UV absorber and a light stabilizer at 120-220° C., and forming a sheet from thus obtained melt-mixed resin composition.

BACKGROUND OF THE INVENTION

In a solar cell module used in photovoltaic power generation, it is general to use an EVA sheet on both sides of the cell for cell protection and additionally a transparent glass substrate on one side facing sunlight and a sheet having excellent moisture-proof and weather resistant properties on the other side, respectively are laminated. The lamination is carried out by layering a transparent substrate, an EVA sheet, a cell, an EVA sheet and a gas-proof sheet, and then crosslinking and binding them together by heat at a certain temperature and pressure.

Since high transparency, adhesiveness and weather resistance after cross-linking is generally required in the EVA sheet for a solar cell encapsulant, various additives such as a crosslinking agent, a co-crosslinking agent, a silane coupling agent, an antioxidant, a light stabilizer, a UV absorber and the like are used, wherein the additives are dry-blended with EVA by a Henschel mixer or a tumbler, or fed to EVA by a separate feeding device for additives, and then melt-mixed with the EVA at a temperature that is the melting point of EVA or higher but not more than the degradation temperature of the crosslinking agent, organic peroxide so as to form an EVA sheet for a solar cell encapsulant.

Since organic peroxides used in a solar cell encapsulant are generally those having a low degradation temperature (1 hour half-life temperature) such as no more than 150° C. for increasing productivity during lamination and cross-linking and reducing the degree of yellowing and the amount of residual peroxides after crosslinking, and since the temperature at which the degradation starts is very low in practice, there is limitation in increasing the process temperature and thus the sheet manufacture is generally carried out by melt-mixing at 120° C. or less. In the meanwhile, if the melt-mixing process is carried out under the conditions for raising shear force in order to increase productivity, heat is generated which may promote the degradation of the organic peroxides, thereby leading pre-crosslinking disadvantageously. Therefore, there have been limitations in making an improvement in productivity.

In the meantime, according to conventional methods for manufacturing an EVA sheet for a solar cell encapsulant wherein all the components to be blended including an EVA resin, additives, a crosslinking agent and the like are mixed and melt-mixed together at once under the conditions involving low shear force, some additives such as an antioxidant or a light stabilizer are not able to be uniformly dispersed in the EVA phase since they have higher melting point that is near the EVA sheet manufacturing temperature or more and thus hardly melt.

Further, when an EVA resin which has a relatively low vinyl acetate content and melting point is used under the conditions involving low shear force and not more than the temperature of the organic peroxide degradation temperature, the dispersion of additives becomes bigger problem, and a problem such as the generation of unmelted gels owing to disuniform melting of the EVA resin used further occurs. However, if the process temperature is raised to solve the problem, the antioxidant and the light stabilizer and the like may directly contact-react with the organic peroxides which can cause reduction of the antioxidation effect, and the amount of organic peroxide for achieving the desired level of crosslinking is further required for complementing the loss of organic peroxide, which may result in yellowing after crosslinking or generation of bubbles. In other case, when additives are fed through a separate feeder to an extruder for the extrusion of an EVA sheet, in particular in case of powder type additives, not liquid type, further problem of sticking of such powder type additives onto the wall of the feeder owing to its intrinsic powder properties or bridging phenomenon may occur, which can prevent feeding of the additives in precise amount.

SUMMARY OF THE INVENTION

The object of the present invention which has been designed to overcome the problems of prior arts as described above, is to provide a method for manufacturing an EVA sheet for a solar cell encapsulant which has stability against yellowing after a crosslinking process and thus good appearance with improved productivity in the sheet manufacture process.

DETAILED DESCRIPTION OF THE INVENTION

The method for manufacturing an EVA sheet for a solar cell encapsulant according to the present invention is characterized by comprising the following steps: (1) melt-mixing an EVA resin with an antioxidant, UV absorber and light stabilizer at 80-220° C. to produce an EVA resin composition; (2) melt-mixing the EVA resin composition with organic peroxide(s) as a crosslinking agent, a co-crosslinking agent and a silane coupling agent at the degradation temperature of the organic peroxide or less; and (3) forming a sheet from the resultant of the step (2).

In the method for manufacturing an EVA sheet for a solar cell encapsulant according to the present invention, the EVA resin preferably has 25-32 wt % of a vinyl acetate (VA) content and 6-30 g/10 minutes of melting index (measured at 190° C., 2.16 kg load). When the VA content is out of said range, transparency, flexibility and anti-blocking properties are lowered disadvantageously, and when the melting index is out of said range, sheet formability and physical properties are lowered disadvantageously.

In the method for manufacturing an EVA sheet for a solar cell encapsulant according to the present invention, in the step (1), it is preferred that 0.005-0.1 parts by weight of an antioxidant, 0.1-0.5 parts by weight of an UV absorber and 0.01-0.3 parts by weight of a light stabilizer, based on 100 parts by weight of the EVA resin, are melt-mixed. The temperature for melt-mixing is preferably 80-220° C. When the temperature is out of said range, the sheet formability becomes degraded disadvantageously.

The antioxidants used in the present invention are not particularly limited, and for example, at least one of phenolic antioxidants, phosphate antioxidants and sulfur antioxidants may be used. As for the examples of the phenolic antioxidants, be Pentaerythritol tetrakis(3-(3,5-di-tert-butyl-4-hydroxyphenyl)propionate) and octadecyl 3-(3,5-di-tert-butyl-4-hydroxyphenyl)propionate) and the like may be mentioned; as for the examples of the phosphate antioxidants, tris(2,4-di-tert-butylphenyl)phosphite and tris(nonylphenyl) phosphite and the like may be mentioned; as for the examples of the sulfur antioxidants, dilauryl thiodipropionate and distearyl thiodipropionate and the like may be mentioned.

The antioxidant is used preferably at the amount of 0.005-0.1 parts by weight, based on 100 parts by weight of the EVA resin. When the amount is less than 0.005 parts by weight, the antioxidation effect is not sufficient enough, and the amount is more than 0.1 parts by weight, it may cause yellowing or give adverse effects in the crosslinking rate.

The UV absorbers used in the present invention are not particularly limited, and for example, at least one of benzophenone UV absorbers and benzotriazole UV absorbers may be used. As for the specific examples of the benzophenone UV absorbers, 2-hydroxy-4-N-octyloxybenzophenone, 2-hydroxy-4-methoxy-benzophenone, 2,2-dihydroxy-4,4-dimethoxybenzophenone, 2-hydroxy-4-octyloxy-benzophenone and the like may be mentioned; and as for the specific examples of the benzotriazole UV absorbers, 2-(2H-benzothiazol-2-yl)-6-(dodecyl)-4-methylphenol and the like may be mentioned.

The UV absorber is used preferably at the amount of 0.1-0.5 parts by weight, based on 100 parts by weight of the EVA resin. When the amount is less than 0.1 parts by weight, the UV absorbing effect is not sufficient enough, and the amount is more than 0.5 parts by weight, it may cause yellowing or become disadvantageous in terms of economy.

The light stabilizers used in the present invention are not particularly limited, and for example, hindered-amine light stabilizer (HALS) and the like may be used. Specifically, for the hindered-amine light stabilizer, at least one of bis(2,2,6,6-tetramethyl-4-piperidyl)sebacate, bis-(N-octyloxy-tetramethyl)piperidinyl sebacate, bis(1,2,2,6,6-pentamethyl-4-piperidyl)sebacate, methyl 1,2,2,6,6-pentamethyl-4-piperidyl sebacate and the like may be used.

The light stabilizer is used preferably at the amount of 0.01-0.3 parts by weight, based on 100 parts by weight of the EVA resin. When the amount is less than 0.01 parts by weight, the light stabilizing effect is not sufficient enough, and the amount is more than 0.3 parts by weight, it becomes disadvantageous in terms of economy.

According to the method for manufacturing a sheet for a solar cell encapsulant of the present invention, in the step (2), a crosslinking agent, a co-crosslinking agent and a silane coupling agent are dry-blended with the EVA resin composition pellet obtained from the step (1) and then the blend is melt-mixed at the degradation temperature of the crosslinking agent, i.e. organic peroxide or less.

Alternatively, in the step (2), while the EVA resin composition pellet in which an antioxidant, a UV absorber and a light stabilizer are homogeneously dispersed, obtained from the step (1) is melted at the degradation temperature of the crosslinking agent, i.e. organic peroxide or less in an extruder, a mixture of a crosslinking agent, co-crosslinking agent and a silane coupling agent is fed into the extruder through a separate feeder.

In the step (2), when the temperature is higher than the degradation temperature of the organic peroxide, the sheet formability is bad or a pre-crosslinking reaction may disadvantageously occur.

As for the organic peroxide used as a crosslinking agent in the present invention, for example, at least one of dialkylperoxide crosslinking agents having 1 hour half-life temperature of 130-160° C. and alkylperoxyester or peroxy ketal crosslinking agents having 1 hour half-life temperature of 100-135° C. may be used. As for the dialkylperoxide crosslinking agents, 2,4-dimethyl-2,5-bis(t-butylperoxy) hexane and the like may be mentioned; as for the alkylperoxyester crosslinking agents, tert-butylperoxy-2-ethylhexyl carbonate and the like may be mentioned; as for the perxoy ketal crosslinking agents, 1,1-di-(t-butylperoxy)-3,3,5-trimethylcyclohexane and the like may be mentioned.

As for the crosslinking agent, it is also possible to use two or more crosslinking agents which have different degradation temperatures(1 hour half-life temperature) from each other. The crosslinking agent is preferably used at the amount of 0.3-1.5 parts by weight, based on 100 parts by weight of the EVA resin. When the amount is less than 0.3 parts by weight, the crosslinking effect is not sufficient enough, and the amount is more than 1.5 parts by weight, it becomes disadvantageous in terms of economy.

The co-crosslinking agents used in the present invention are not particularly limited, and for example polyallyl compounds or polymethacryloxy compounds may be used. As a specific example, triallyl isocyanurate and the like may be mentioned.

The co-crosslinking agent is preferably used at the amount of 0.3-1.5 parts by weight, based on 100 parts by weight of the EVA resin. When the amount is less than 0.3 parts by weight, the crosslinking effect is not sufficient enough, and the amount is more than 1.5 parts by weight, it becomes disadvantageous in terms of economy.

The silane coupling agents used in the present invention are not particularly limited, and for example organosilicon compounds may be used. As a specific example, 3-methacryloxypropyl trimethoxysilane and the like may be mentioned.

The silane coupling agent is preferably used at the amount of 0.3-1.5 parts by weight, based on 100 parts by weight of the EVA resin. When the amount is less than 0.3 parts by weight, any effect is not exerted, and the amount is more than 1.5 parts by weight, it becomes disadvantageous in terms of economy.

In the method for manufacturing a sheet for a solar cell encapsulant according to the present invention, conventional and common additives other than the above-mentioned components may be further added as required.

INDUSTRIAL AVAILABILITY

By the method for manufacturing an EVA sheet for a solar cell encapsulant according to the present invention, it is possible to maximize dispersion of the additives which makes possible to minimize the amount of additives used and the amount of the crosslinking agent used. Therefore, the amount being extruded without yellowing in the sheet production can be increased, which can lead to provide increase productivity in the sheet manufacturing as well as good appearance and increased resistance to yellowing owing to the reduced amount of residual crosslinking agents.

EMBODIMENTS FOR PRACTICING THE INVENTION

The present invention is further illustrated in detail through the following examples, however, the scope of the present invention is not limited to these examples.

EXAMPLES

Example 1

Based on 100 parts by weight of a EVA resin(VA content: 28 wt %, melt index 15 g/10 minutes, Samsung Total E280PV) without any additives, according to the composition shown in Table 1 below, 0.05 parts by weight of Naugard P(tris(nonylphenyl)phosphite) from Adeka, as an antioxidant, 0.3 parts by weight of Chimassorb 81(2-hydroxy-4-octyloxy-benzophenone) from Ciba, as a UV absorber, 0.1 parts by weight of Tinuvin 770(bis(2,2,6,6-tetramethyl-4-piperidyl)sebacate) from Ciba, as a UV stabilizer were mixed and then fed to an extruder, and the mixture and the EVA resin were melt-mixed at the extrusion temperature of 190° C. so as to obtain EVA resin composition in the form of a pellet. To 100 parts by weight of the EVA resin composition pellet thus obtained, 0.7 parts by weight of Luperox TBEC(t-butyl-2-ethylhexyl monoperoxycarbonate) fromo Arkema Inc. as a crosslinking agent and 0.5 parts by weight of TAICROS(triallyl isocyanurate) from Evonik as a co-crosslinking agent and 0.5 parts by weight of OFS 6030(3-methacryloxy propyl trimethoxysiloxane) from Dow corning as a silane coupling agent were added and mixed together, and the mixture was extruded at the extrusion temperature of 90° C. and T-die temperature of 100° C. with 2.5 m/minute of the linear speed of the sheet to form a sheet having a thickness of 0.45 mm. The results of productivity and appearance of the sheet were represented in Table 1 below.

Example 2

A sheet was manufactured according to the above method as in Example 1, except that the sheet linear speed was 8.0 m/minute. The results of productivity and appearance of the resulted sheet were represented in Table 1 below.

Example 3

A sheet was manufactured according to the above method as in Example 1, except that the T-die temperature was 110° C., and the sheet linear speed was 10 m/minute. The productivity and appearance of the resulted sheet was determined and the results were represented in Table 1 below.

Comparative Example 1

Based on 100 parts by weight of a EVA resin(VA content: 28 wt %, melt index 15 g/10 minutes, Samsung Total E280PV), according to the composition shown in Table 1 below, 0.05 parts by weight of Naugard P (tris(nonylphenyl) phosphite) from Adeka, as an antioxidant, 0.3 parts by weight of Chimassorb 81(2-hydroxy-4-octyloxy-benzophenone) from Ciba, as a UV absorber, 0.1 parts by weight of Tinuvin 770(bis(2,2,6,6-tetramethyl-4-piperidyl)sebacate) from Ciba, as a UV stabilizer, 0.7 parts by weight of Luperox TBEC (t-butyl-2-ethylhexyl monoperoxycarbonate) fromo Arkema Inc. as a crosslinking agent, 0.5 parts by weight of TAICROS (triallyl isocyanurate) from Evonik as a co-crosslinking agent and 0.5 parts by weight of OFS 6030 (3-methacryloxy propyl trimethoxysiloxane) from Dow corning as a silane coupling agent were mixed together and extruded at the extrusion temperature of 90° C. and T-die temperature of 100° C. with the sheet linear speed of 6.5 m/minute so as to obtain a sheet having a thickness of 0.45 mm. The results of productivity and appearance of the resulted sheet were represented in Table 1 below.

Comparative Example 2

A sheet was manufactured according to the above method as in Comparative example 1, except that the sheet linear speed was 10 m/minute. The results of productivity and appearance of the resulted sheet were represented in Table 1 below.

Comparative Example 3

A sheet was manufactured according to the above method as in Comparative example 1, except that Luperox TBEC (t-butyl-2-ethylhexyl monoperoxycrabonate) was used at the amount of 1.0 part by weight. The results of productivity and appearance of the resulted sheet were represented in Table 1 below.

TABLE 1

| | | | | | | (parts by weight) |
| --- | --- | --- | --- | --- | --- | --- |
| | Example 1 | Example 2 | Example 3 | Comp. example 1 | Comp. example 2 | Comp. example 3 |
| EVA resin | 100 | 100 | 100 | 100 | 100 | 100 |
| Naugard P | 0.1 | 0.1 | 0.1 | 0.05 | 0.05 | 0.05 |
| Chimassorb 81 | 0.2 | 0.2 | 0.2 | 0.3 | 0.3 | 0.3 |
| Tinuvin 770 | 0.1 | 0.1 | 0.1 | 0.1 | 0.1 | 0.1 |
| Luperox TBEC | 0.7 | 0.7 | 0.7 | 0.7 | 0.7 | 1.0 |
| TAICROS | 0.5 | 0.5 | 0.5 | 0.5 | 0.5 | 0.5 |
| OFS 6030 | 0.5 | 0.5 | 0.5 | 0.5 | 0.5 | 0.5 |
| Sheet productivity (meter/min.) | 6.5 | 8.0 | 10 | 6.5 | 10 | 6.5 |
| Die temperature (° C.) | 100 | 100 | 110 | 100 | 110 | 100 |
| Sheet appearance | colorless | colorless | colorless | light yellow | light yellow | light yellow |

Example 4

The EVA sheet (200 mm×160 mm) obtained from Example 1 was laid on low-iron tempered glass (200 mm×200 mm) and then back sheet (200 mm×200 mm) (obtained from DNP) was laid on the EVA sheet, subjected to vacuum condition at 150°

C. for 6 minutes, and cross-linked together while maintaining the pressure difference between the upper part and the lower part of the laminator to 0.4 Mpa for 11 minutes, thereby manufacturing a specimen.

After cooling the specimen at room temperature, bubbles remained in the specimen were observed with naked eyes. The degree of cross-linking of the specimen was determined and Yellowing Index (YI) thereof was measured by using UltraScan PRO Colorimeter (Hunter Lab.). Next, the specimen was incubated(85° C., relative humidity 85%) for 1,000 hours and its YI was measured again. The difference (ΔYI) between the initial yellowing and the yellowing after incubation and physical properties of the crosslinked sheet obtained from the above lamination were determined and represented in Table 2 below.

Example 5

A specimen was manufactured according to the above method as in Example 4, except using the EVA sheet obtained from Example 2. The results of the appearance observation and measured YI and physical properties were represented in Table 2 below.

Example 6

A specimen was manufactured according to the above method as in Example 4, except using the EVA sheet obtained from Example 3. The results of the appearance observation and measured YI and physical properties were represented in Table 2 below.

Comparative Example 4

A specimen was manufactured according to the above method as in Example 4, except using the EVA sheet obtained from Comparative example 1. The results of the appearance observation and measured YI and physical properties were represented in Table 2 below.

Comparative Example 5

A specimen was manufactured according to the above method as in Example 4, except using the EVA sheet obtained from Comparative example 2. The results of the appearance observation and measured YI and physical properties were represented in Table 2 below.

Comparative Example 6

A specimen was manufactured according to the above method as in Example 4, except using the EVA sheet obtained from Comparative example 3. The results of the appearance observation and measured YI and physical properties were represented in Table 2 below.

From the results as represented in the above Tables 1 and 2, it is found out that Examples 1-3 showed improved productivity owing to uniform dispersion of the additives and excellent Yellowing resistance, and Examples 4-6 in which the sheets manufactured in Examples 1-3 according to the present invention were used for lamination and crosslinking showed excellent appearance and yellowing resistance as compared to Comparative examples 4-6.

What is claimed is:

1. A method for manufacturing a sheet for a solar cell encapsulant, comprising:
    (1) melt-mixing an EVA resin with an antioxidant, UV absorber and light stabilizer at 80-220° C. and producing EVA resin composition pellets;
    (2) dry-blending the EVA resin composition pellets with organic peroxide(s) as a crosslinking agent, a co-crosslinking agent and a silane coupling agent at the degradation temperature of the organic peroxide or less, and melt-mixing the resulting blend, each of the crosslinking agent, the co-crosslinking agent and the silane coupling agent being used at an amount of 0.3-1.5 parts by weight based on 100 parts by weight of the EVA resin; and
    (3) forming the sheet from the resultant of the step (2).

2. The method according to claim 1, wherein in the step (1), 0.005-0.1 parts by weight of the antioxidant, 0.1-0.5 parts by weight of the UV absorber and 0.01-0.3 parts by weight of the light stabilizer, based on 100 parts by weight of the EVA resin, are melt-mixed.

3. The method according to claim 2, wherein the EVA resin has 25-32 wt % of a vinyl acetate content and 6-30 g/10 minutes of melting index measured at 190° C. under 2.16 kg load.

4. The method for manufacturing a sheet for a solar cell encapsulant according to claim 2, wherein the antioxidant is at least one selected from the group consisting of phenolic antioxidants, phosphite antioxidants and sulfur antioxidants.

5. The method according to claim 2, wherein the UV absorber is at least one selected from the group consisting of benzophenone UV absorbers and benzotriazole UV absorbers.

6. The method according to claim 2, wherein the light stabilizer is a hindered-amine light stabilizer.

7. The method according to claim 1, wherein the EVA resin has 25-32 wt % of a vinyl acetate content and 6-30 g/10 minutes of melting index measured at 190° C. under 2.16 kg load.

8. The method for manufacturing a sheet for a solar cell encapsulant according to claim 1, wherein the antioxidant is at least one selected from the group consisting of phenolic antioxidants, phosphite antioxidants and sulfur antioxidants.

TABLE 2

|  | Example 4 | Example 5 | Example 6 | Comp. example 4 | Comp. example 5 | Comp. example 6 |
| --- | --- | --- | --- | --- | --- | --- |
| Degree of cross-linking (%) | 84.5 | 86.0 | 85.1 | 84.7 | 83.2 | 85.2 |
| Presence of bubbles remaining after cross-linking | No bubbles | No bubbles | No bubbles | No bubbles | No bubbles | bubbles present |
| Initial yellowing(YI) | 1.46 | 1.53 | 1.58 | 1.68 | 1.92 | 2.4 |
| Difference in Yellowing(ΔYI) | 3.32 | 3.25 | 3.6 | 6.87 | 8.20 | 8.14 |

9. The method according to claim 1, wherein the UV absorber is at least one selected from the group consisting of benzophenone UV absorbers and benzotriazole UV absorbers.

10. The method according to claim 1, wherein the light stabilizer is a hindered-amine light stabilizer.

11. The method according to claim 1, wherein two or more organic peroxides having different degradation temperatures from each other are used as the crosslinking agent.

12. The method according to claim 1, wherein the pellets are formed by an extruder.

13. The method according to claim 1, wherein the pellets are formed by an extruder at a temperature of 190° C.

* * * * *